US009082851B2

(12) United States Patent
Ramachandran et al.

(10) Patent No.: US 9,082,851 B2
(45) Date of Patent: Jul. 14, 2015

(54) FINFET HAVING SUPPRESSED LEAKAGE CURRENT

(71) Applicant: International Business Machines Corporation, Armonk, NY (US)

(72) Inventors: Ravikumar Ramachandran, Pleasantville, NY (US); Henry K. Utomo, Newburgh, NY (US); Reinaldo Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 14/087,655

(22) Filed: Nov. 22, 2013

(65) Prior Publication Data
US 2015/0145064 A1    May 28, 2015

(51) Int. Cl.
| H01L 27/01 | (2006.01) |
| H01L 29/78 | (2006.01) |
| H01L 29/66 | (2006.01) |
| H01L 29/06 | (2006.01) |
| H01L 29/10 | (2006.01) |

(52) U.S. Cl.
CPC .......... *H01L 29/785* (2013.01); *H01L 29/0649* (2013.01); *H01L 29/1083* (2013.01); *H01L 29/66795* (2013.01)

(58) Field of Classification Search
CPC ............ H01L 29/66795; H01L 29/785; H01L 21/823431; H01L 27/0886; H01L 27/1211; H01L 21/76283; H01L 21/845; H01L 21/76243; H01L 21/76224
USPC ................................... 257/288, 324, 347, 368
See application file for complete search history.

(56) References Cited

U.S. PATENT DOCUMENTS

| 5,838,026 | A | 11/1998 | Kitagawa et al. |
| 6,171,929 | B1 | 1/2001 | Yang et al. |
| 6,297,126 | B1 | 10/2001 | Lim et al. |
| 6,350,661 | B2 | 2/2002 | Lim et al. |
| 6,445,042 | B1 | 9/2002 | Yu et al. |
| 6,455,361 | B1 | 9/2002 | Nihei et al. |
| 6,500,728 | B1 | 12/2002 | Wang |
| 7,018,891 | B2 | 3/2006 | Doris et al. |
| 7,488,650 | B2 | 2/2009 | Schulz |
| 7,566,619 | B2 | 7/2009 | Ahn et al. |
| 8,148,772 | B2 | 4/2012 | Doyle et al. |
| 8,236,634 | B1 | 8/2012 | Kanike et al. |
| 8,236,637 | B2 | 8/2012 | Utomo et al. |
| 8,415,214 | B2 | 4/2013 | Jakubowski et al. |
| 2011/0291188 | A1* | 12/2011 | Cheng et al. .................. 257/347 |
| 2012/0168913 | A1* | 7/2012 | Toh et al. ...................... 257/618 |
| 2013/0292805 | A1* | 11/2013 | Cai et al. ....................... 257/622 |
| 2014/0191321 | A1* | 7/2014 | Cheng et al. .................. 257/347 |

* cited by examiner

*Primary Examiner* — Dung Le
(74) *Attorney, Agent, or Firm* — Joseph P. Abate; Ira D. Blecker

(57) ABSTRACT

A FinFET device which includes: a semiconductor substrate; a three dimensional fin oriented perpendicularly to the semiconductor substrate; a local trench isolation between the three dimensional fin and an adjacent three dimensional fin; a nitride layer on the local trench isolation; a gate stack wrapped around a central portion of the three dimensional fin and extending through the nitride layer; sidewall spacers adjacent to the gate stack and indirectly in contact with the nitride layer, two ends of the three dimensional fin extending from the sidewall spacers, a first end being for the source of the FET device and a second end being for a drain of the FET device; and an epitaxial layer covering each end of the three dimensional fin and being on the nitride layer. Also disclosed is a method of fabricating a FinFET device.

13 Claims, 21 Drawing Sheets

US 9,082,851 B2

FINFET HAVING SUPPRESSED LEAKAGE CURRENT

BACKGROUND

The present invention relates to the fabrication of FinFET semiconductor devices and, more particularly, relates to the formation of a nitride capping layer over the local trench isolation which limits local trench isolation recessing during processing and limits outdiffusion from the fins in NFET devices.

FinFET devices and FinFET structures are nonplanar devices and structures typically built on a bulk semiconductor substrate or a semiconductor on insulator (SOI) substrate. The FinFET devices are field effect transistors (FETs) which may comprise a vertical semiconductor fin, rather than a planar semiconductor surface, having a single, double or triple gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing, according to a first aspect of the exemplary embodiments, a FinFET device which includes: a semiconductor substrate; a three dimensional fin oriented perpendicularly to the semiconductor substrate; a local trench isolation between the three dimensional fin and an adjacent three dimensional fin; a nitride layer on the local trench isolation; a gate stack wrapped around a central portion of the three dimensional fin and extending through the nitride layer; sidewall spacers adjacent to the gate stack and indirectly in contact with the nitride layer, two ends of the three dimensional fin extending from the sidewall spacers, a first end being for the source of the FET device and a second end being for a drain of the FET device; and an epitaxial layer covering each end of the three dimensional fin and being on the nitride layer.

According to a second aspect of the exemplary embodiments, there is provided a method of fabricating a FinFET device which includes: forming a three dimensional fin on a semiconductor substrate; depositing a local trench isolation layer on the semiconductor substrate and adjacent to the three dimensional fin to separate the three dimensional fin from an adjacent three dimensional fin; anisotropically depositing a nitride layer over the local trench isolation layer and over the three dimensional fin; forming a dielectric layer over the nitride layer; forming a gate stack that is wrapped around a central portion of the three dimensional fin and being in direct contact with the dielectric layer that is formed over the nitride layer and local trench isolation layer; forming two spacers adjacent to the gate stack, the two spacers wrapped around a central portion of the three dimensional fin and being in direct contact with the dielectric layer that is formed over the nitride layer and local trench isolation layer, an end of the three dimensional fin extending from each spacer; removing the dielectric layer except from underneath the two spacers and the gate stack; and forming a silicon layer adjacent to the ends of the three dimensional fins.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 7 illustrate a first embodiment of a FinFET semiconductor structure wherein:

FIG. 1 illustrates the formation of 3D fins on a semiconductor substrate;

FIG. 2 illustrates the formation of a local trench isolation between the 3D fins;

FIG. 3 illustrates the formation of a nitride layer on the local trench isolation;

FIG. 4 illustrates the formation of a dielectric layer on the 3D fins and on the nitride layer;

FIG. 7 is a perspective view of the FinFET semiconductor structure in FIGS. 6A and 6B.

FIGS. 8A to 10A and 8B to 10B illustrate a second embodiment of a FinFET semiconductor structure wherein:

FIGS. 8A and 8B illustrate the structure of FIGS. 6A, 6B and 7 wherein the source and drain layers are undoped silicon and in which the nitride caps on the 3D fins have been removed;

FIGS. 10A and 10B illustrate the formation of source and drain epitaxial layers and an interlayer dielectric.

FIGS. 11A to 15A, 11B to 15B and 16 illustrate a third embodiment of a FinFET semiconductor structure wherein:

FIGS. 11A and 11B illustrate the structure of FIGS. 6A, 6B and 7 wherein the source and drain layers are epitaxial layers and the gate structure has been removed;

FIGS. 15A and 15B illustrate the formation of the replacement gate stack; and

FIG. 16 is a perspective view of the FinFET semiconductor structure in FIGS. 15A and 15B.

FIGS. 17 to 19, 20A to 24A and 20B to 24B illustrate a fourth embodiment of a FinFET semiconductor structure wherein:

FIG. 17 illustrates an SOI substrate having 3D fins;

FIG. 18 illustrates the formation of a nitride layer between the 3D fins and on the 3D fins;

FIG. 19 illustrates the formation of a dielectric layer on the 3D fins and on the nitride layer;

FIGS. 20A and 20B illustrate the formation of a gate stack and sidewall spacers;

FIGS. 24A and 24B illustrate the formation of the replacement gate stack.

DETAILED DESCRIPTION

Figure 1:
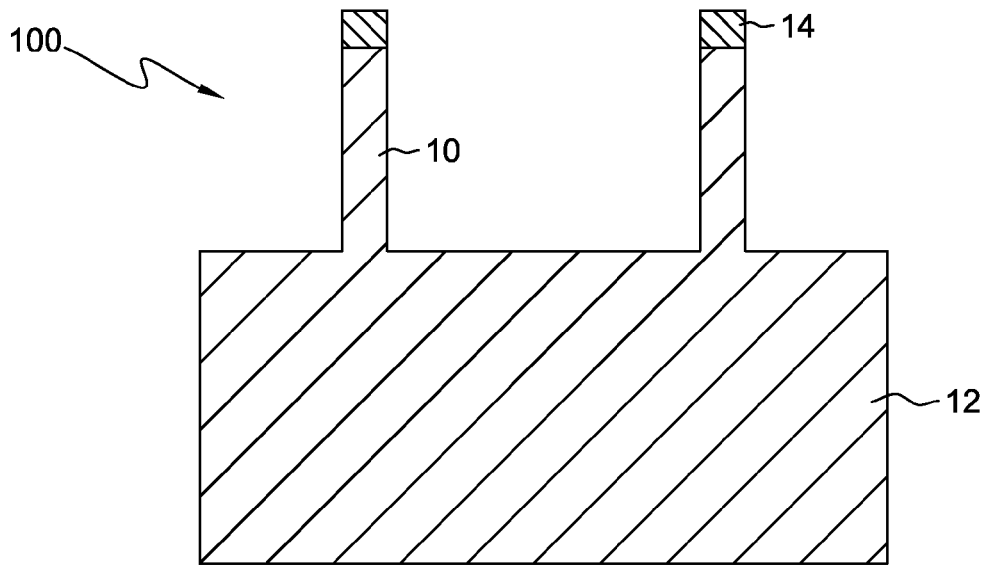

FinFETs are three dimensional (3D) structures. Each 3D device may include a narrow vertical fin body of semiconductor material with vertically-projecting sidewalls. A gate contact or electrode may intersect a channel region of the fin body and may be isolated electrically from the fin body by a thin gate dielectric layer. Flanking the central channel region at opposite ends of the fin body are doped source/drain regions.

While the exemplary embodiments have applicability to both bulk FinFETs and to FinFETs built on an SOI substrate, the exemplary embodiments are particularly useful for bulk FinFETs.

Bulk FinFETs present certain problems such as achieving low off-state leakage. There are two significant factors which contribute to bulk FinFET off-state leakage. The first problem relates to NFET (N-type FET) devices, wherein the region below the active fin is typically doped with boron in order to suppress leakage (this could be a well implant or a punch-through stopper (PTS) implant), because in this region the gate does not exert significant control. However, since the local trench isolation between the fins is typically made of oxide, this boron may segregate into this oxide during subsequent thermal steps, thereby reducing the final boron concentration in the "sub-fin" region which increases thermal leakage from the source to the drain in the NFET devices.

The second problem relates to both NFET devices and PFET (P-type FET) devices, for which the source/drain regions for each are formed by in-situ doped epitaxial growth, followed by some outdiffusion of the dopants into the fin regions to form a doped extension that is overlapped by the gate electrode. The problem here is that these dopants also diffuse vertically toward the substrate, exacerbating the first problem previously mentioned. This problem is made worse by the fact that these epitaxial depositions are preceded by a cleaning step, which may etch into the local trench isolation and expose more fin sidewall for the epitaxial layer to grow. In turn, the dopant outdiffusion from the epitaxial layer begins deeper down vertically along the fin.

These problems may be addressed by either increasing the well/PTS doping (but this increases junction leakage and proper dopant placement is difficult to achieve) and/or by reducing the epitaxial pre-clean steps (which has a lower limit, because if the pre-clean step is too small, then the quality of the epitaxial growth will be poor). Both approaches effectively have a design space which is finite and not very effective at small scales.

The core aspect of the exemplary embodiments is to form a capping layer over the local trench isolation region that is of a different dielectric material, namely HDP (high density plasma) nitride or some other type of nitride which may be anisotropically deposited. The capping layer creates an etch barrier which limits or eliminates local trench recess during the source/drain epitaxial pre-clean step. It furthermore eliminates boron outdiffusion into the portion of the local trench region defined by this nitride, which in turn reduces NFET sub-fin leakage. An additional benefit is that the presence of nitride as the dielectric boundary for source/drain epitaxial growth may result in less epitaxial faceting, resulting in more epitaxial volume for what is otherwise the same fin pitch and fin height, and therefore more channel stress and lower external resistance.

Referring to the Figures in more detail, and particularly referring to FIGS. 1 to 7, there is disclosed a process for fabricating a FinFET semiconductor structure 100. The process will be described first with respect to a bulk semiconductor substrate but the process is equally applicable to SOI substrates.

FIGS. 1 to 4 are cross sections of the FinFET semiconductor structure 100 near an end of the fins.

In FIG. 1, 3D fins 10 have been conventionally formed by a lithographic process on a bulk semiconductor substrate 12 in which portions of the bulk semiconductor substrate 12 have been etched away to result in 3D fins 10. It should be understood that 3D fins have a length which extends into the viewing plane. Each 3D fin 10 may have a nitride cap 14 leftover from the nitride mask used to lithographically form the 3D fins 10.

The bulk semiconductor substrate 12 may comprise any semiconductor material including but not limited to silicon, silicon germanium, germanium, III-V compound, or II-VI compound semiconductor.

Figure 2:
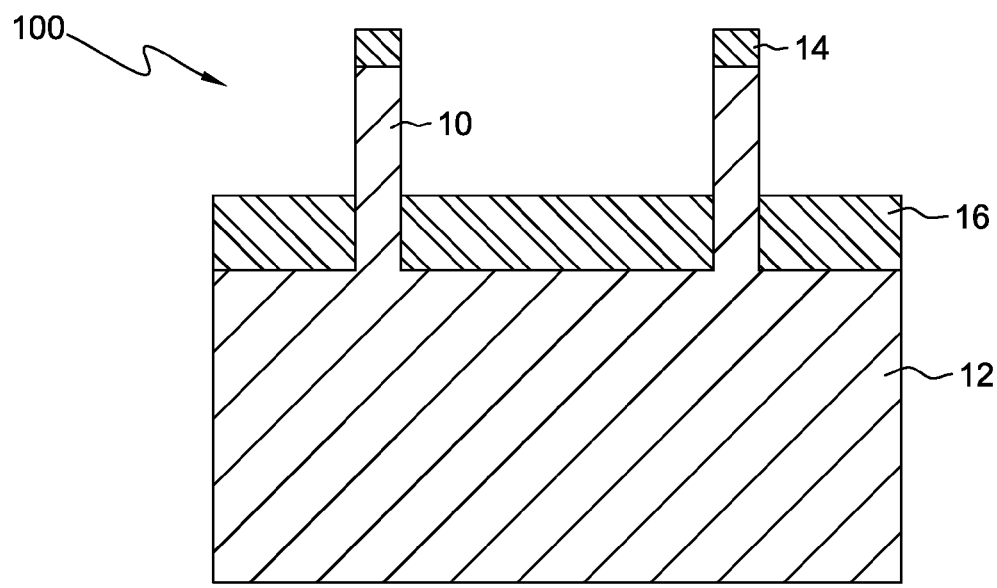

Referring now to FIG. 2, a local trench isolation 16 is formed by a process that may include blanket deposition of an oxide to fill the spaces between the fins 10 and then planarized to the tops of the nitride caps 14. The oxide may then be etched back by a wet etch process such as dilute hydrofluoric acid (HF) to a predetermined level such as about 30 to 60 nm. for bulk FinFETs. Alternatively, the part of the fin exposed after etch back of the oxide is typically 20 to 40 nm. The nitride caps 14 subsequently may be removed by, for example, a wet etch process such as phosphoric acid.

The 3D fins 10 may be conventionally doped before or after the local trench isolation 16 is formed.

Figure 3:
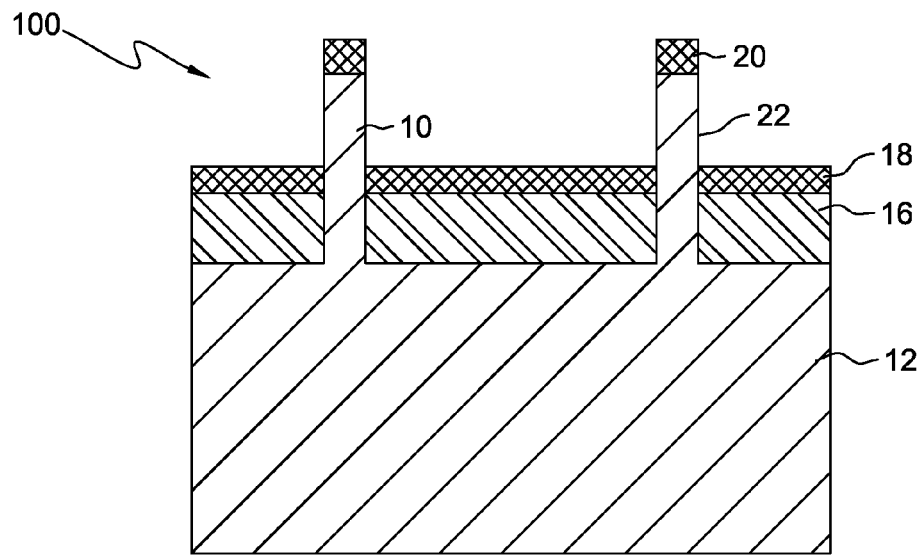

Thereafter, as shown in FIG. 3, silicon nitride may be anisotropically deposited to form nitride layer 18 over the local trench isolation 16. Nitride may also be deposited on the tops of the 3D fins 10 during the formation of nitride layer 18 to form nitride caps 20. The nitride layer 18 and nitride caps 20 each may have a thickness of about 10 to 20 nm. The silicon nitride may be anisotropically deposited by a process such as high density plasma (HDP) or gas cluster ion beam implant (GCIB) which deposit the silicon nitride at a higher vertical rate than lateral rate. Even if there is some silicon nitride deposited on the 3D fin sidewalls 22, it will be thinner than that deposited as nitride layer 18 and nitride caps 20. A small isotropic etchback such as by a phosphoric acid wet etch and/or an isotropic reactive ion etch may be performed to remove any nitride from the fin sidewalls 22 without adversely affecting the nitride layer 18 and nitride caps 20.

Figure 4:
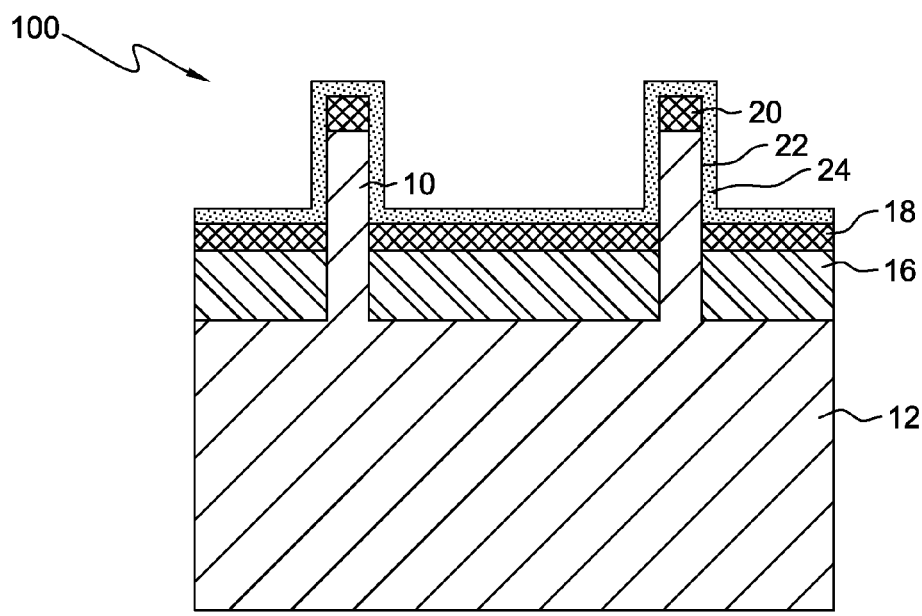

Referring now to FIG. 4, a dielectric layer 24 is formed on the nitride layer 18, nitride caps 20 and 3D fin sidewalls 22. Preferably, the dielectric layer 24 is an oxide and will be referred to as such hereafter. Amorphous carbon is another option for the dielectric layer 24 although not as preferred as the oxide. The oxide layer 24 may be about 3 nm thick. The oxide layer 24 may be formed by a thermal oxidation process or an oxide may be deposited to form the oxide layer 24.

In the following FIGS. 5A, 5B, 6A, 6B, the "A" figure is a cross sectional view similar to FIGS. 1 to 4 and the "B" figure is a side view looking from the right side of the "A" view.

Figure 5A:
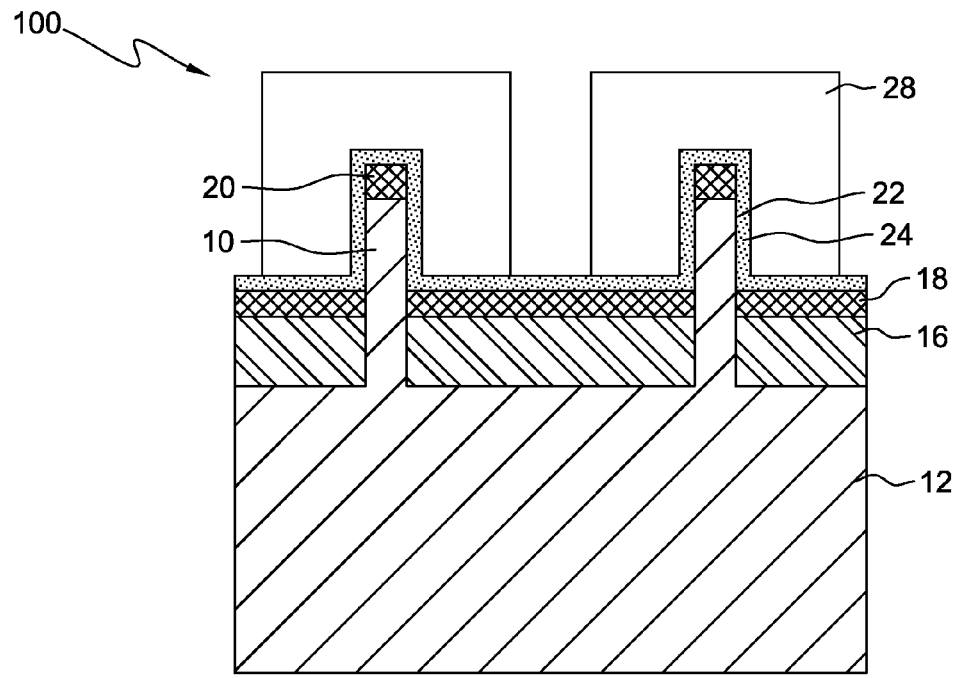
FIGS. 5A and 5B illustrate the formation of a gate stack and sidewall spacers.
Figure 5B:
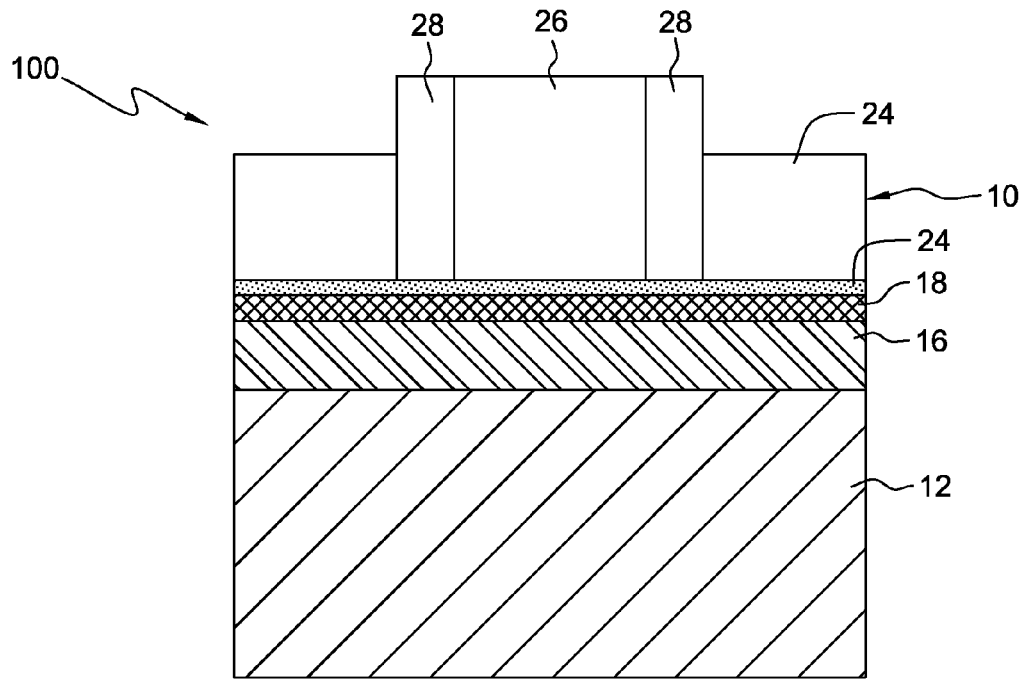

Referring now to FIGS. 5A and 5B, a gate stack 26 and sidewall spacers 28 may be formed on the central portion of the 3D fins 10. The gate stack 26 may be formed by a conventional process and wraps around the central portion of the 3D fins 10. Thereafter, spacer material, for example, a nitride, may be deposited over the 3D fins 20 and then etched back, for example by a reactive ion etching process, to form the sidewall spacers 28 which also wrap around the central portion of the 3D fins 10. Both the gate stack 26 and sidewall spacers 28 are in direct contact with the oxide layer 24 that is present on the nitride layer 18 and nitride caps 20 as well as the fin sidewalls 22. The gate stack 26 may be a conventional gate stack or a replacement gate stack. In the latter case, the gate stack 26 is a "dummy" gate stack comprising polysilicon over a gate dielectric such as oxide which are later removed and filled with the final gate stack material. Process steps for a replacement gate process will be described later. FIGS. 5A and 5B show the oxide layer 24 remaining after the sidewall spacer etch. The oxide layer 24 may actually be consumed during the sidewall spacer etch depending on the nitride-to-oxide etch selectivity.

Figure 6A:
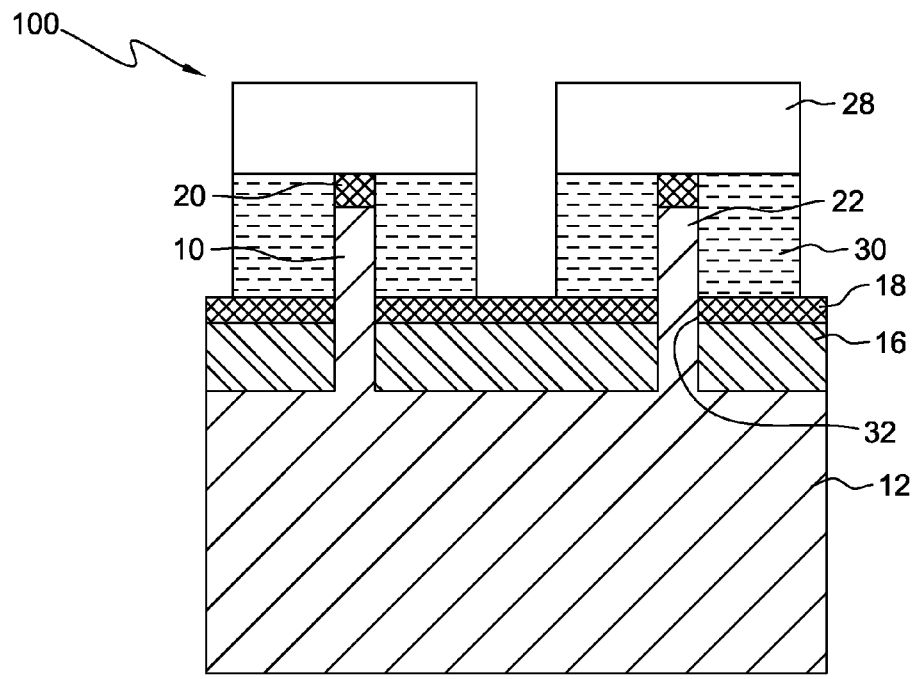
FIGS. 6A and 6B illustrate the formation of source and drain layers.
Figure 6B:
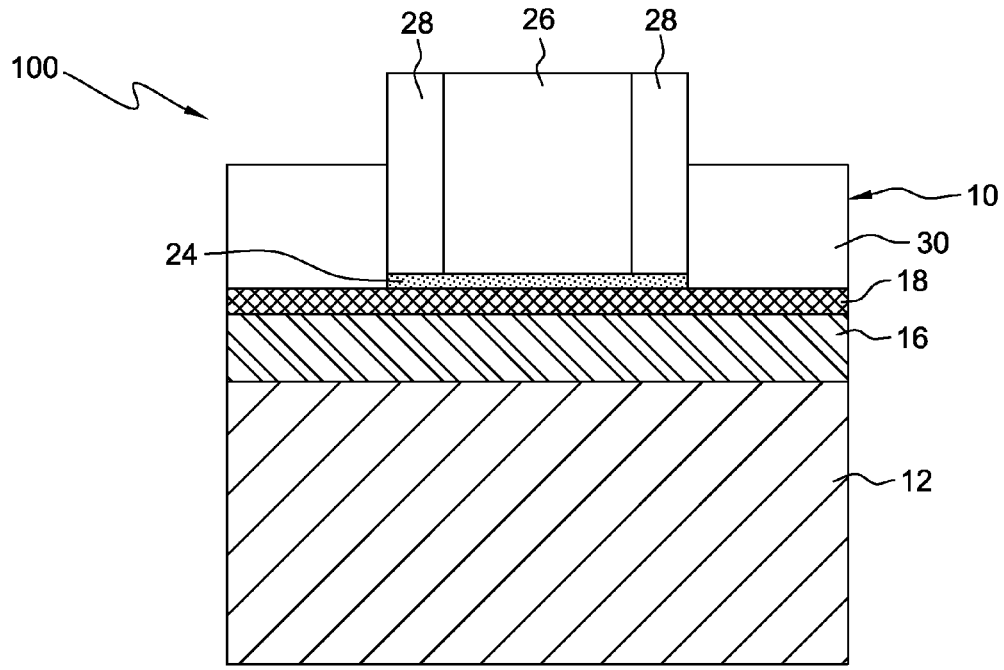

The sources and drains 30 are next formed by an epitaxial process as shown in FIGS. 6A and 6B. The source/drain epitaxy 30 is shown as growing from both sides of the 3D fins 10 with the nitride caps 20 separating the two epitaxial regions. As a result of having the nitride layer 18 over the local trench isolation 16, the pre-clean steps associated with the epitaxial growth will not erode the top surface of the local trench region as severely, if at all. The epitaxial pre-clean will remove the residual oxide layer 24 (if any, left after the formation of spacers 28) from the fin sidewalls 22, the nitride layer 18 and the nitride caps 20. There may exist a small lateral undercut of the oxide layer 24 under the sidewall spacers 28, to form an epitaxial "foot" region (not shown in FIGS. 6A and 6B for clarity), but this lateral etch will be confined by the thickness of the oxide layer 24, and so will be less severe than if it took place into the local trench isolation region.

Additionally, any boron that exists in the portion 32 of the 3D fin sidewall 22 adjacent to the nitride layer 18 will not segregate into the nitride layer 18. The improved boron retention in this portion 32 of the 3D fin, which is just below the region where the gate electrode exerts control, may result in reduced off-state leakage in the NFET devices.

Furthermore, the presence of the nitride layer 18 on the local trench isolation 16 may result in a different epitaxial growth front moving away from the 3D fin sidewalls 22. In other words, with nitride as the dielectric boundary rather than the oxide of the local trench isolation 16, there may be less faceting of the epitaxial growth, upwards away from the local trench top surface. This means that more epitaxial material may fit within the same volume (defined by fin spacing, fin height, and gate-to-gate spacing), and therefore more strain if materials such as silicon germanium are used as the source/drain epitaxial material 30 for PFETs.

Figure 7:
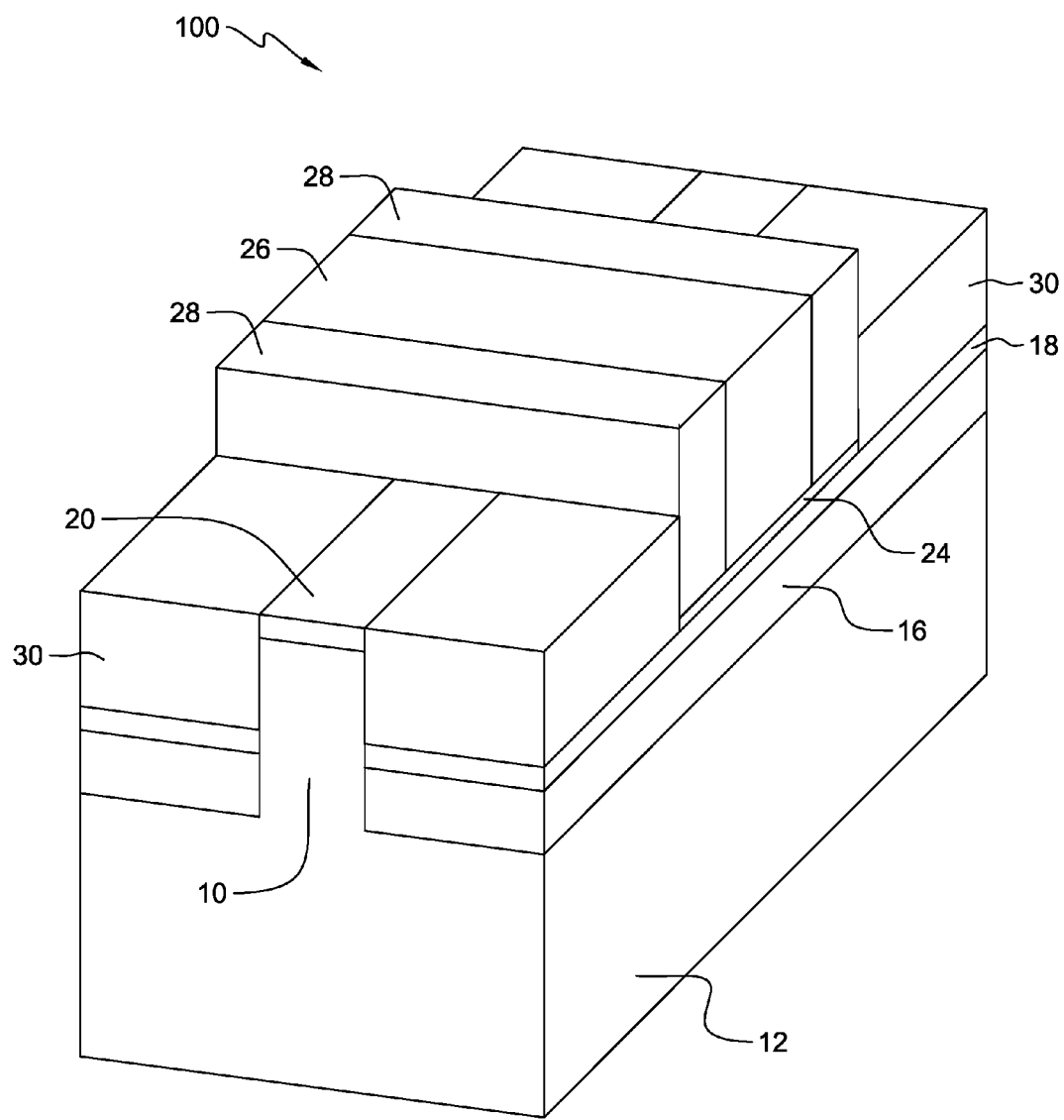

A perspective view of the FinFET semiconductor structure 100 is shown in FIG. 7 after formation of the source/drain epitaxy 30. There may be subsequently deposited an interlayer dielectric material (not shown) such as an oxide interlayer dielectric material over the source/drain epitaxy 30 so that the interlayer dielectric material is approximately at the same height as the sidewall spacers 28 and gate stack 26. In the embodiment shown in FIG. 7, the gate stack 26 is the final gate stack. The FinFET semiconductor structure 100 may undergo further semiconductor processing to form contacts and back end of the line wiring. It should be noted that the oxide layer 24 remains between the sidewall spacers 28 and the nitride layer 18 as well as between the gate stack 26 and the nitride layer 18.

Another exemplary embodiment of FinFET semiconductor structure 200 is described with respect to FIGS. 8A to 10A and 8B to 10B where the "A" figure is a cross sectional view similar to FIGS. 1 to 4 and the "B" figure is a side view looking from the right side of the "A" view.

Figure 8A:
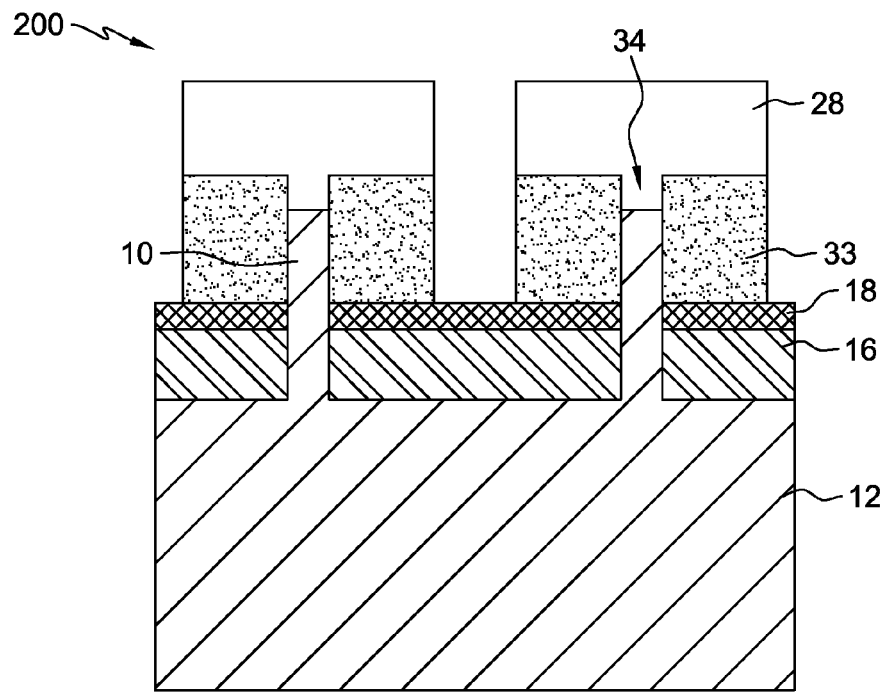
Figure 8B:
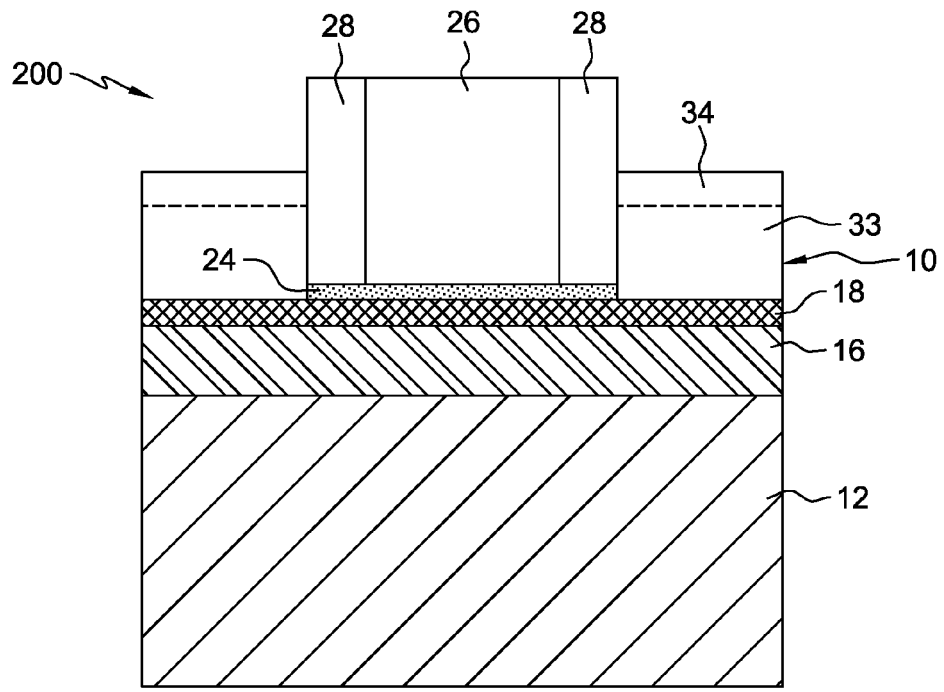
Figure 9A:
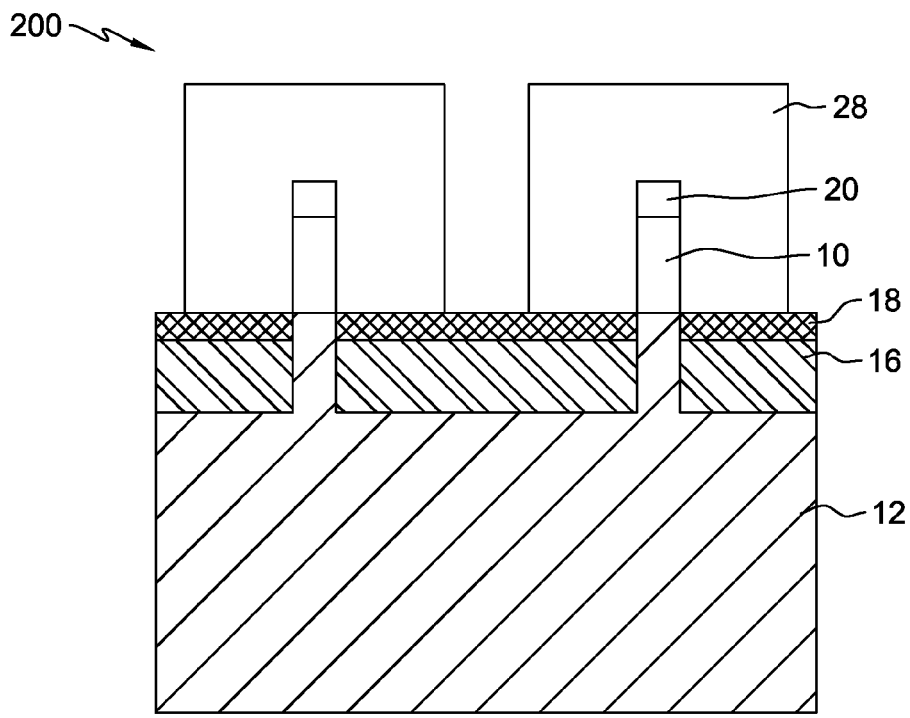
FIGS. 9A and 9B illustrate the recessing of the 3D fins outside of the gate area and removal of the undoped silicon.
Figure 9B:
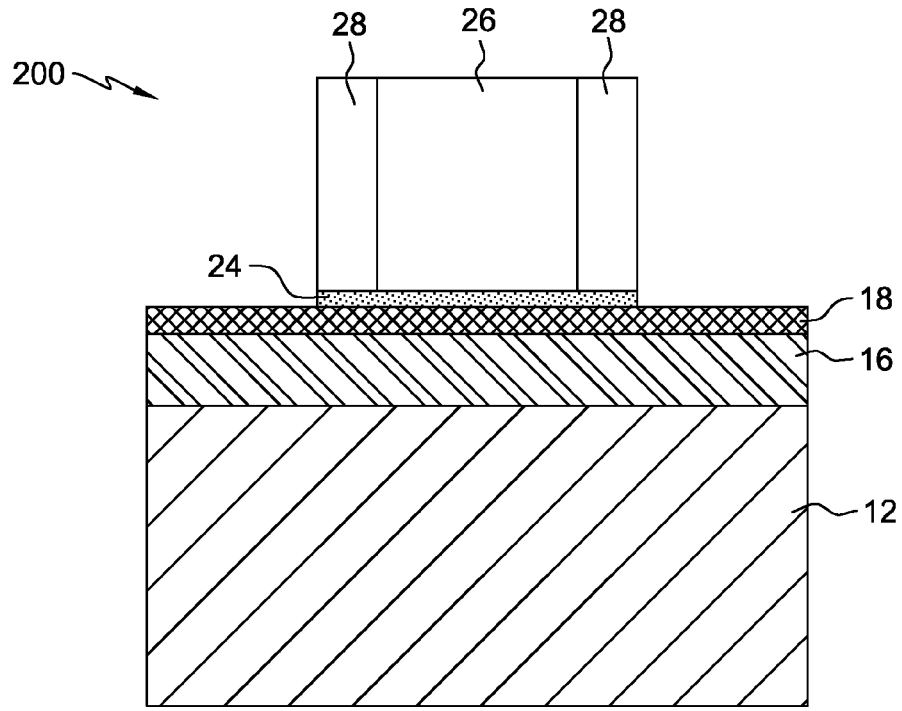

In this exemplary embodiment, it may be desirable to recess the 3D fins 10 before formation of the source/drain epitaxy. In this case, the source/drain epitaxy 30 shown in FIGS. 6A, 6B and 7 may be replaced with undoped silicon 33 as shown in FIGS. 8A and 8B. A nitride etch, preferably a reactive ion etch, may be performed to remove the nitride caps 20 resulting in trenches 34. The undoped silicon 33 protects the nitride layer 18 during the etching of the nitride caps 20. Thereafter, the 3D fins 10 may be removed by an etching process which may also etch the undoped silicon 33 at the same time. The etching process may include a wet etch, such as ammonium hydroxide, and/or a reactive ion etch. The resulting structure is shown in FIGS. 9A and 9B.

Figure 10A:
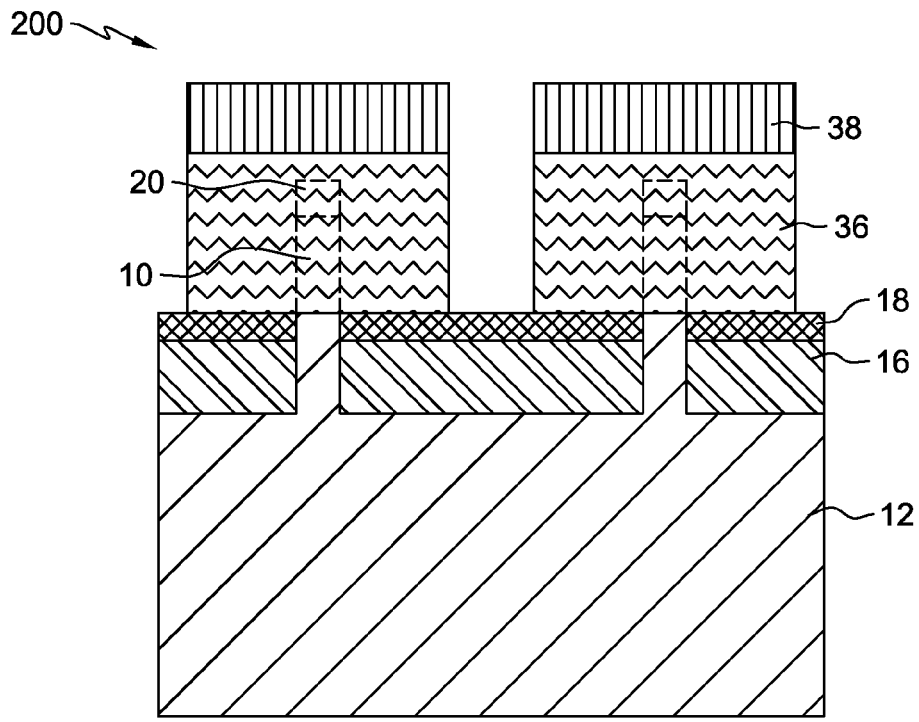
Figure 10B:
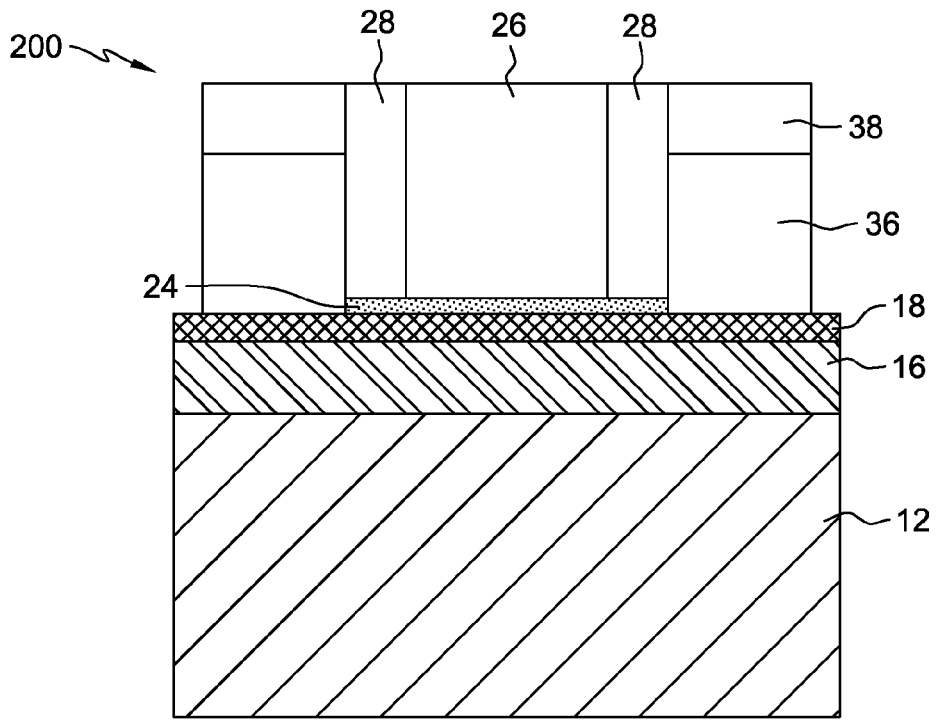

Thereafter, as shown in FIGS. 10A and 10B, source/drain epitaxy 36 has been formed on nitride layer 18 and on recessed 3D fin 10. Interlayer dielectric material may be deposited on the source/drain epitaxy 36 to form interlayer dielectric 38. The interlayer dielectric material may include oxide or an oxide followed by a nitride.

Another exemplary embodiment of FinFET semiconductor structure 300 is described with respect to FIGS. 11A to 15A, 11B to 15B and 16 where the "A" figure is a cross sectional view similar to FIGS. 1 to 4 and the "B" figure is a side view looking from the right side of the "A" view.

In this exemplary embodiment, the starting structure is that as described in FIGS. 6A, 6B and 7 except that the gate stack is a dummy gate stack and will be removed and replaced by a replacement gate stack. An interlayer dielectric layer 40 has been added as described previously.

Figure 11A:
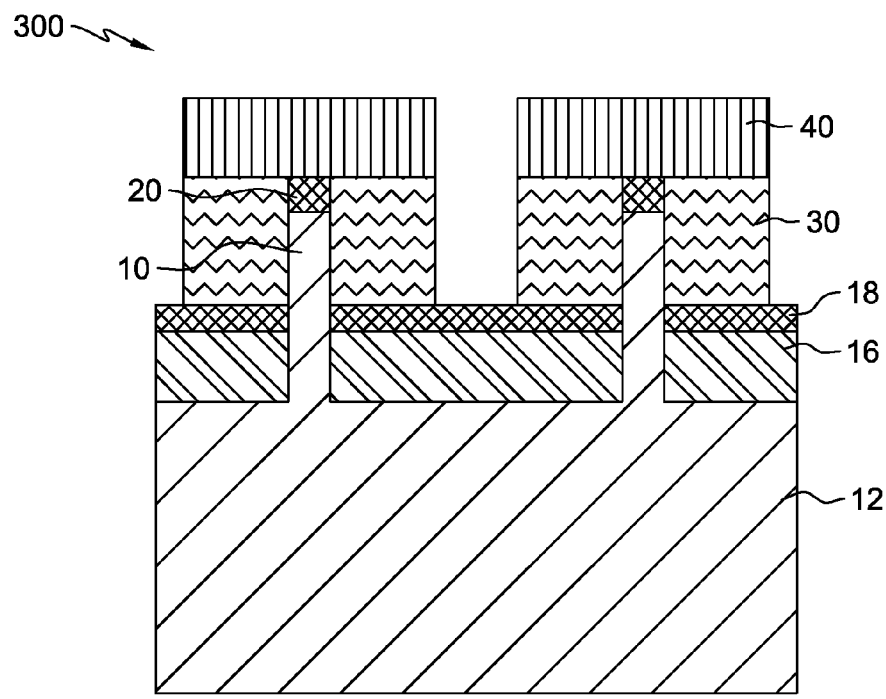
Figure 11B:
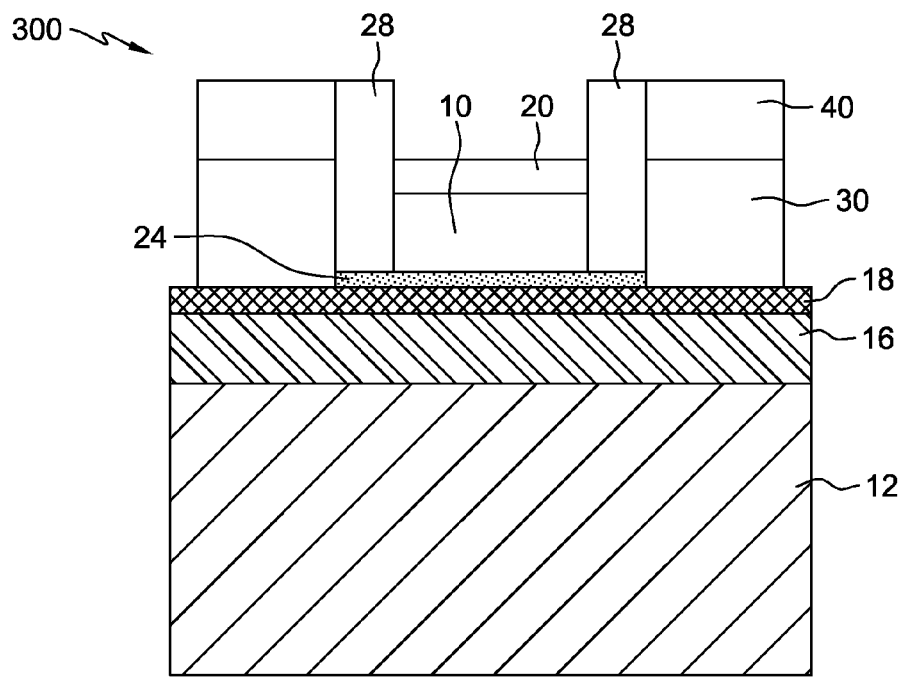

Referring now to FIGS. 11A and 11B, the gate stack 26 shown in FIGS. 6A, 6B and 7 has been etched away. The gate stack 26 may be etched by a wet etch, such as ammonium hydroxide, and/or a reactive ion etch. After the etching of the gate stack 26, the central portion of the 3D fin 10 and nitride cap 20 will be exposed.

Figure 12A:
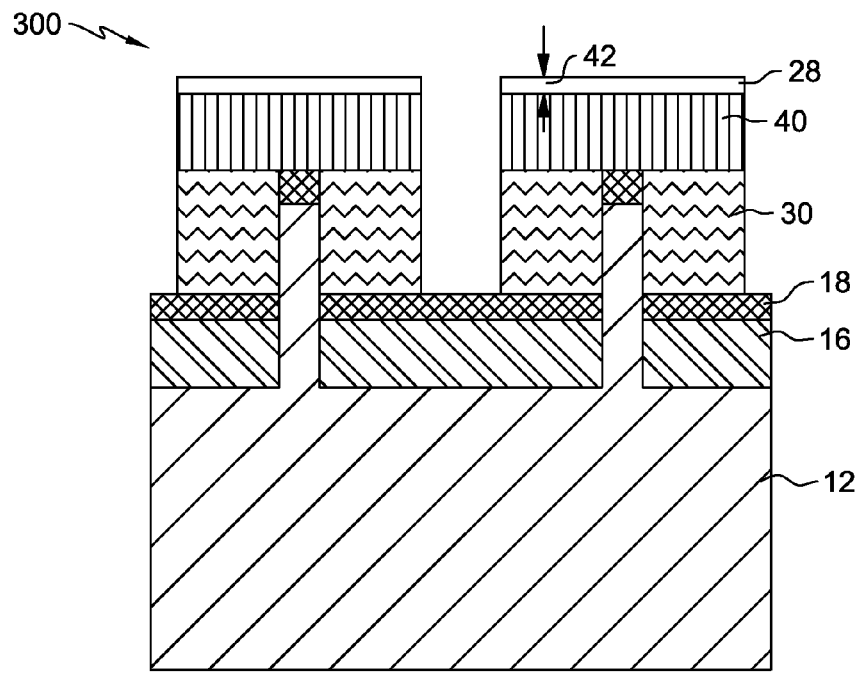
FIGS. 12A and 12B illustrate the removal of the dielectric layer in the gate area.
Figure 12B:
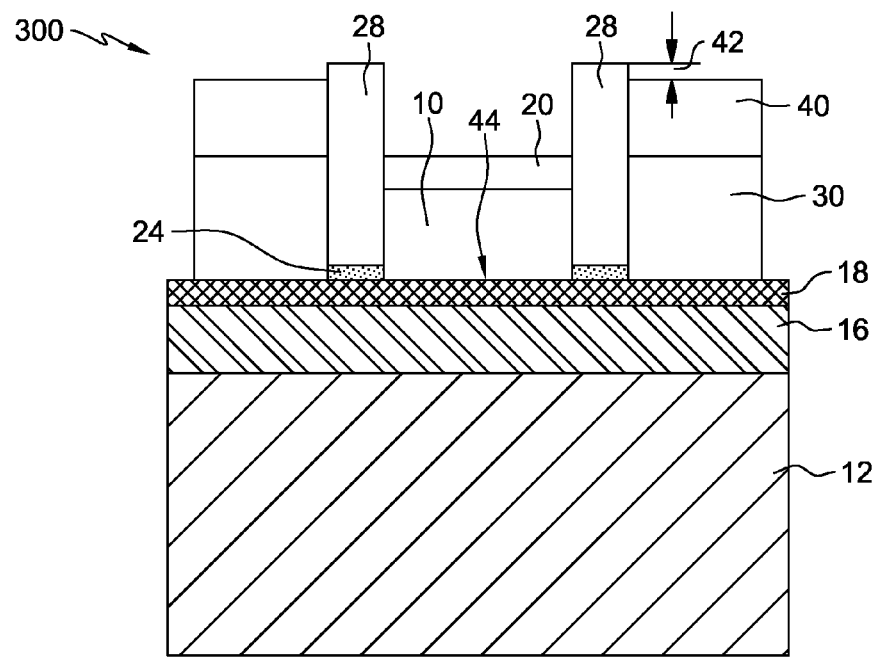

The dummy gate oxide of the gate stack 26 and any oxide layer 24 on the 3D fin 10 and nitride cap 20 may be etched by a combination of dilute HF wet etching and dry etching. During the etching of the gate oxide, the oxide layer 24 formerly underneath the gate stack is also etched away which may recess the interlayer dielectric 40 slightly, as indicated by gap 42. After etching of the oxide layer 24, there is provided a self-aligned exposure of the nitride layer 18, indicated by arrow 44 over the local trench isolation 16 as shown in FIGS. 12A and 12B.

Figure 13A:
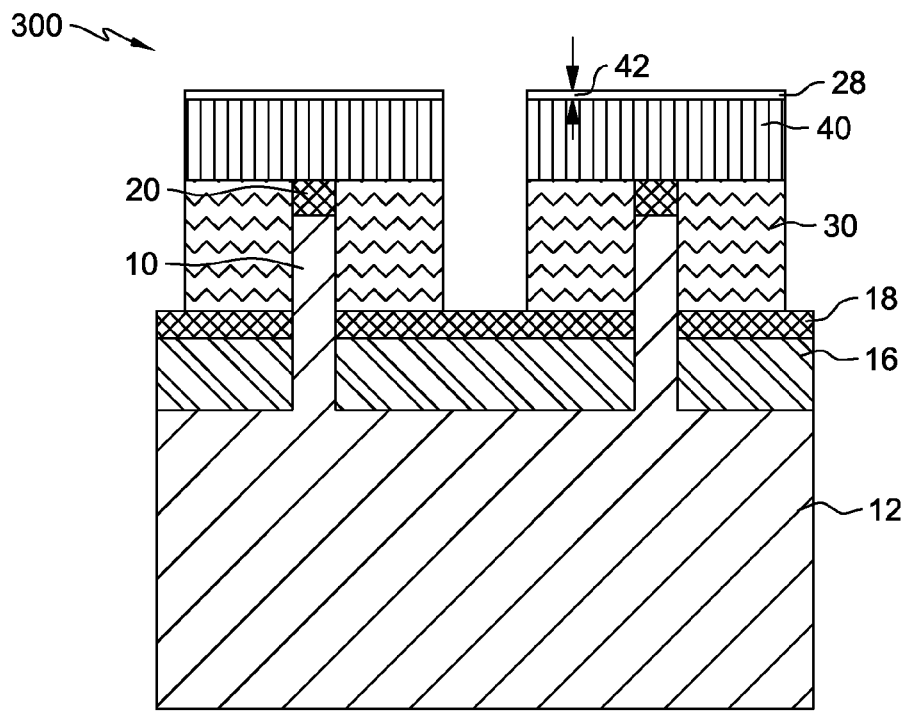
FIGS. 13A and 13B illustrate the recessing of the gate area by the removal of the nitride layer in the gate area.
Figure 13B:
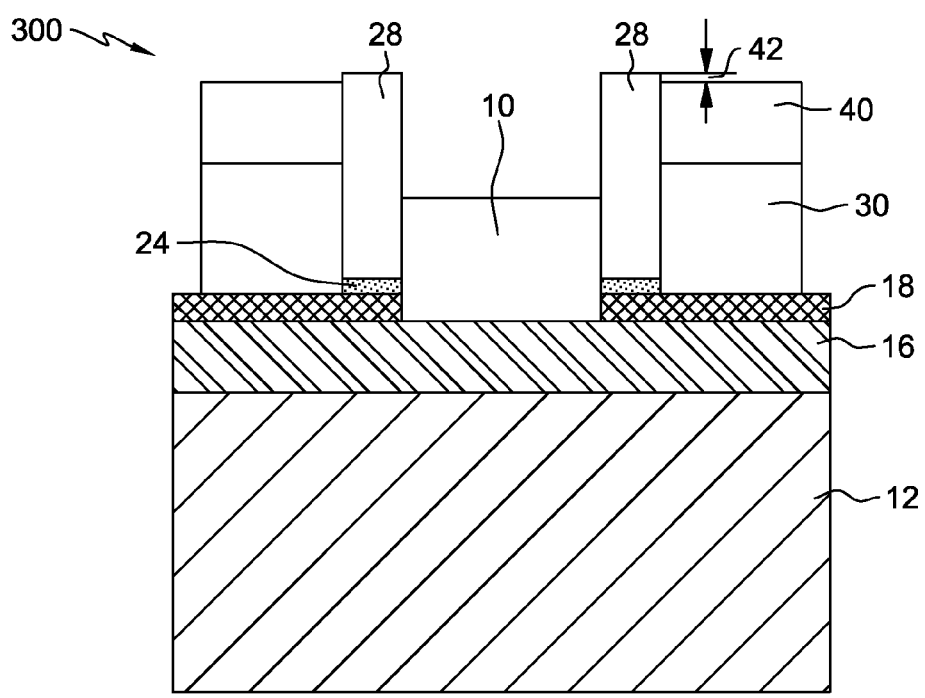

Since the interlayer dielectric 40 is oxide, the exposed nitride layer 18 may be anisotropically etched with a selective RIE which will also remove the nitride cap 20 on the top of the 3D fins 10 within the gate region. There will also be some etching of the sidewall spacers 28 which are typically nitride. The structure thus far is shown in FIGS. 13A and 13B. The amount of gate recess achieved may be explicitly defined by the thickness of the nitride layer 18 over the local trench isolation 16.

Figure 14A:
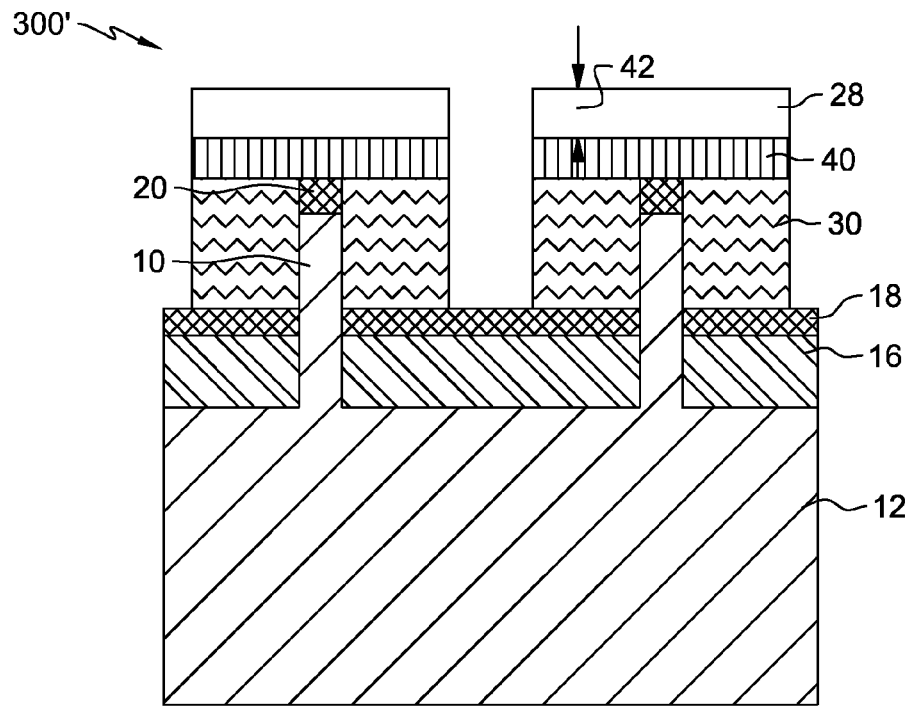
FIGS. 14A and 14B illustrate an alternative process in which the gate area is recessed into the local trench isolation.
Figure 14B:
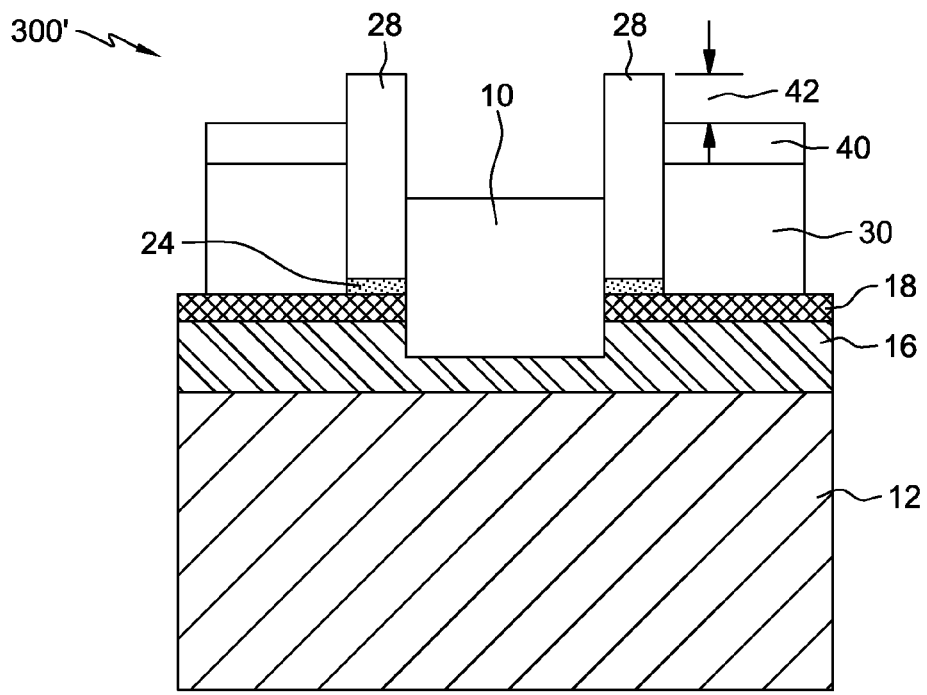

In an alternative embodiment of FinFET semiconductor structure 300' as shown in FIGS. 14A and 14B, the gate recess etch may go beyond the nitride layer 18 and into the local trench isolation 16. Since both the local trench isolation 16 and interlayer dielectric 40 may both be oxide, the etching of the local trench isolation 16 will also erode some of the interlayer dielectric 40, thereby increasing the gap 42. This FinFET semiconductor structure 300' may be subsequently processed by a chemical-mechanical process after the replacement gate has been added to level the sidewall spacers 28 and replacement gate with the interlayer dielectric 40.

Figure 15A:
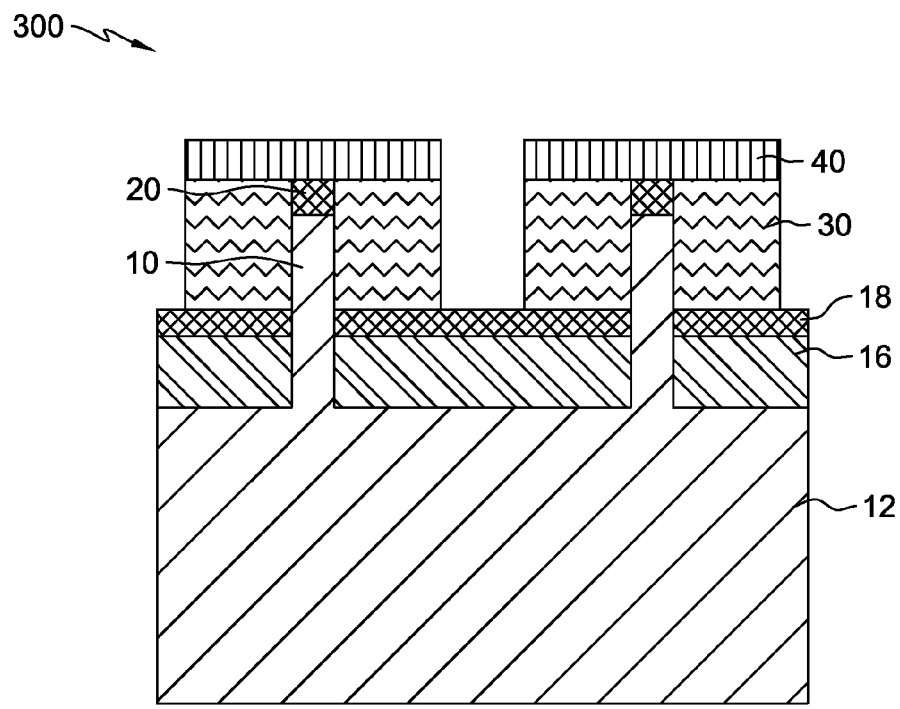
Figure 15B:
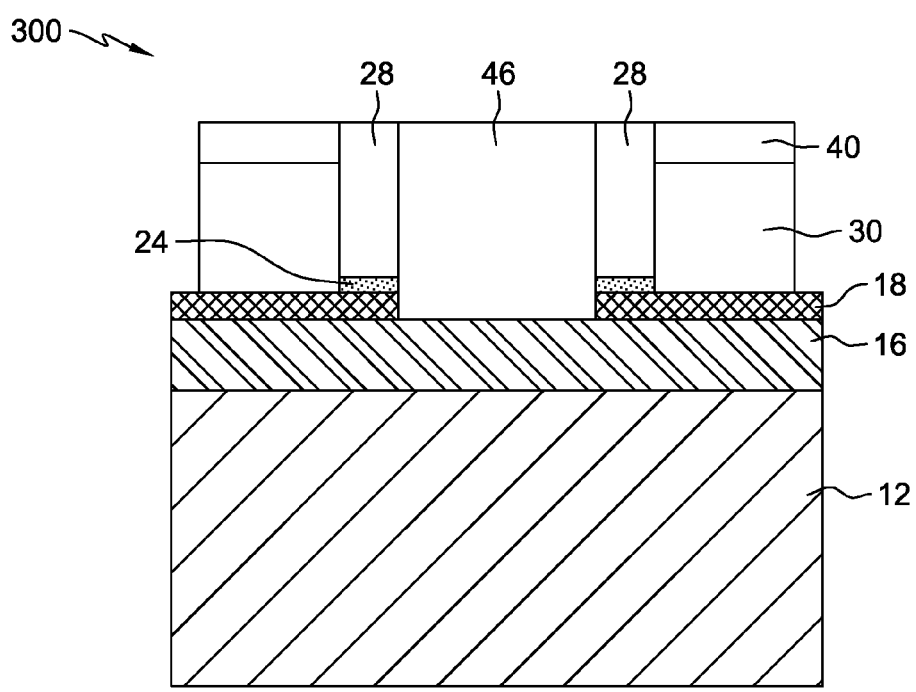

Referring again to FinFET semiconductor structure 300 now in FIGS. 15A and 15B, replacement gate structure 46 has been added so as to be in direct contact with the local trench isolation 16 and then the FinFET semiconductor structure 300 was planarized. The replacement gate structure 46 may include, for example, a gate dielectric, gate electrode, work function metals and nitride cap.

Figure 16:
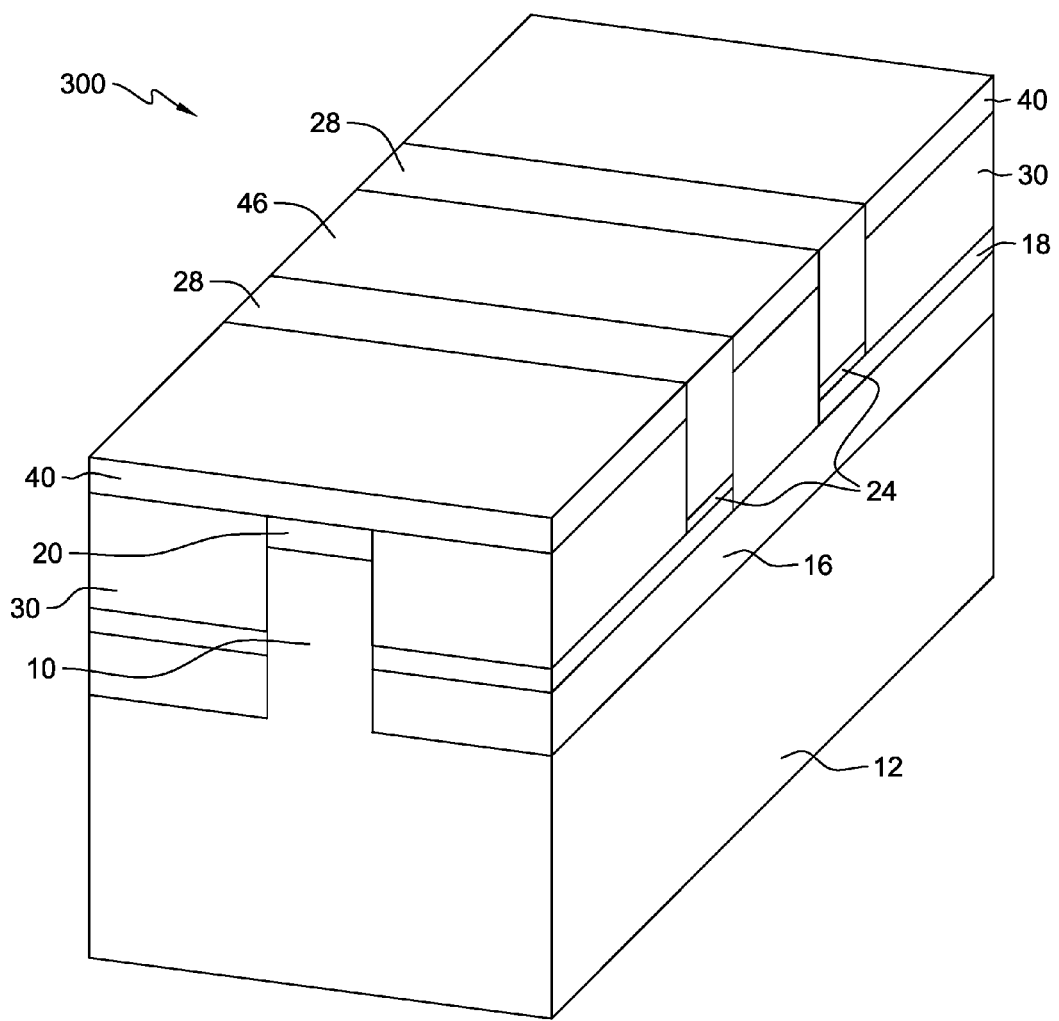

A perspective view of the FinFET semiconductor structure 300 is shown in FIG. 16. The FinFET semiconductor structure 300 may undergo further semiconductor processing to form contacts and back end of the line wiring. It should be noted that the oxide layer 24 remains between the sidewall spacers 28 and the nitride layer 18. A particular advantage of FinFET structure 300 is that the gate structure 46 is recessed below the level of the source/drain epitaxy 30.

There are quite a few benefits to gate recess as shown in FIG. 16, but the main benefit is that, since the gate controls part of the fin underneath the source/drain region (i.e., what was previously the "sub-fin" region), thermal leakage is suppressed. This permits a reduction in PTS (punch through stopper) doping, which reduces the associated variability coming from random dopant fluctuation. Another important advantage is that since the gate covers a larger portion of the fin, the effective channel width is larger, which leads to increased drive current per fin.

The FinFET semiconductor structure 300 may also be formed with recessed 3D fins as described with respect to FinFET semiconductor structure 200.

Figure 17:
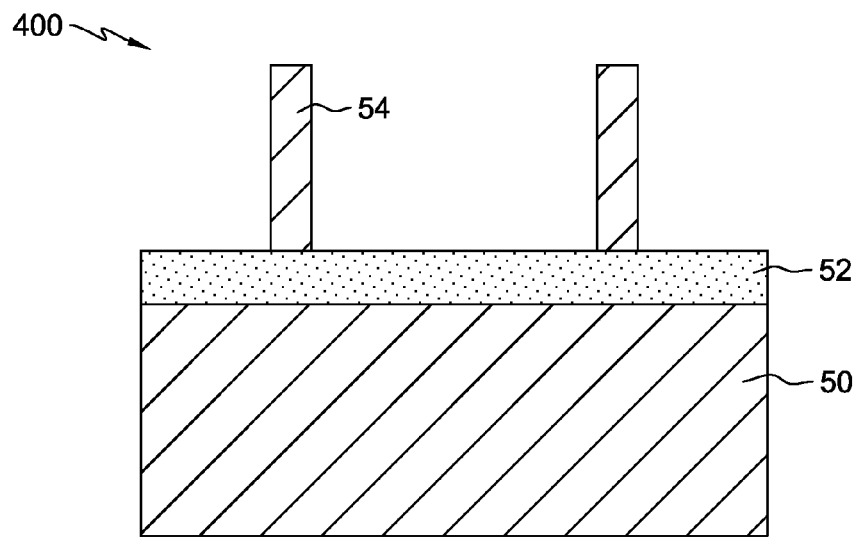
Figure 18:
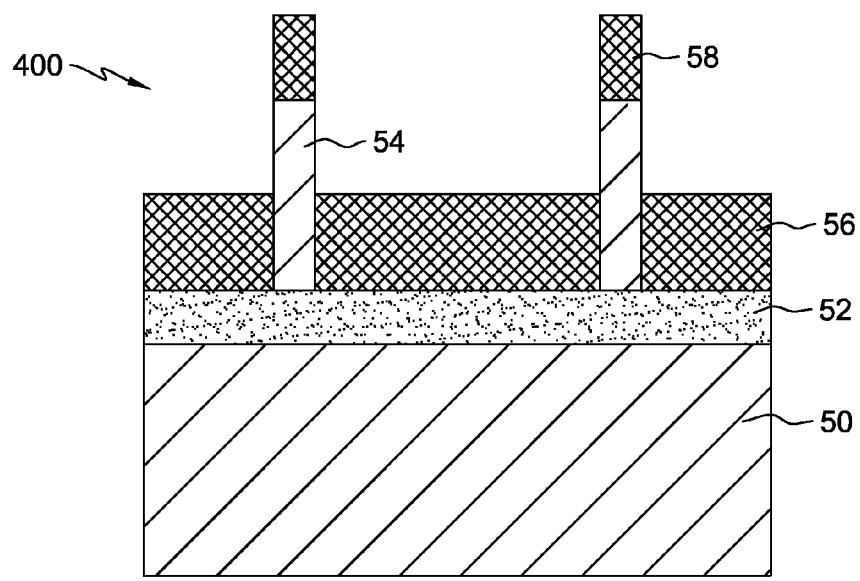
Figure 19:
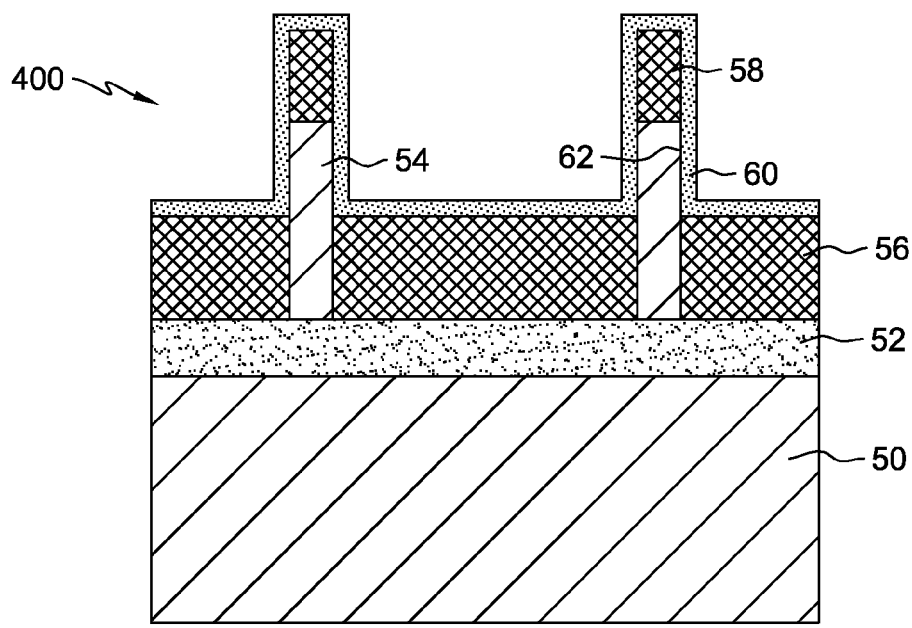

Another exemplary embodiment of FinFET semiconductor structure 400 is described with respect to FIGS. 17 to 19, 20A to 24A and 20B to 24B where FIGS. 17 to 19 and the "A" figure is a cross sectional view similar to FIGS. 1 to 4 and the "B" figure is a side view looking from the right side of the "A" view.

FinFET semiconductor structure 400 utilizes an SOI substrate but a bulk semiconductor may be used for this embodiment as well. In this exemplary embodiment, the local trench isolation is not used and instead, a thicker nitride layer is used.

Referring now to FIG. 17, 3D fins 54 have been conventionally formed on an SOI substrate comprising a semiconductor base 50 and buried oxidation layer (referred to hereafter as a "BOX layer") 52.

In FIG. 18, a silicon nitride layer 56 (hereafter just "nitride") has been anisotropically deposited as previously described. Nitride caps 58 may be formed on the tops of the fins 54 as well. The nitride layer 56 may be about 10 to 20 nm thick as in the previous embodiments or may be thicker to make allowance for the missing local trench isolation layer. In one exemplary embodiment, the nitride layer 56 may have a thickness of about 20 to 30 nm.

Referring now to FIG. 19, a dielectric layer 60, typically an oxide, may be formed on the nitride layer 56, nitride caps 58 and fin sidewalls 62. The oxide layer may be about 3 nm thick.

Figure 20A:
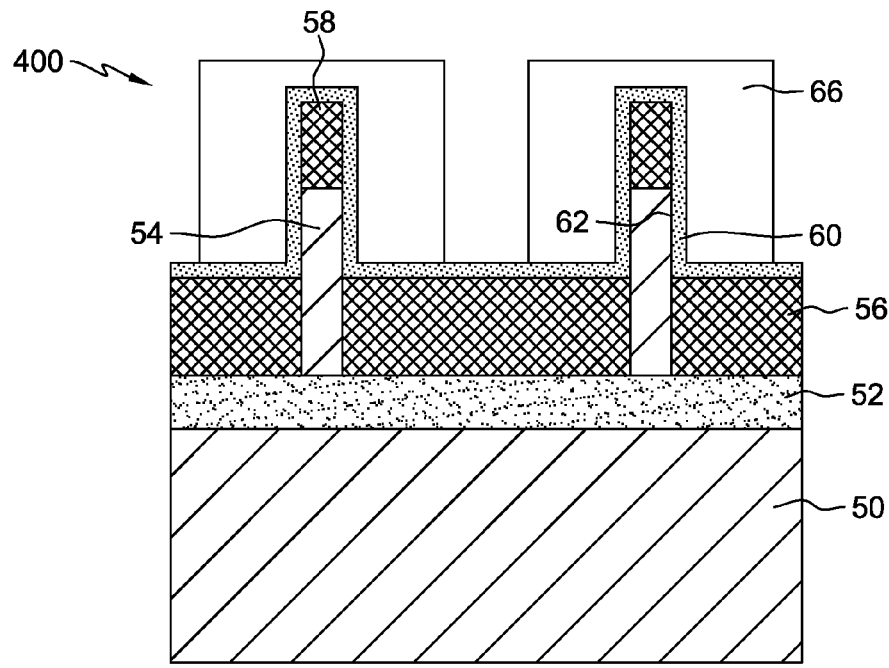
Figure 20B:
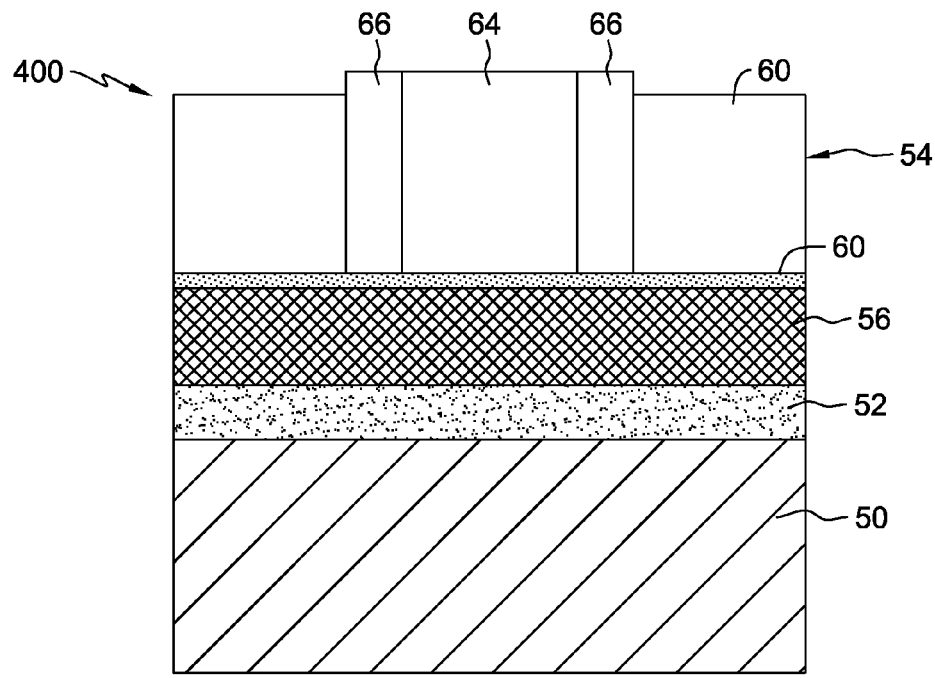

Referring now to FIGS. 20A and 20B, a gate stack 64 and sidewall spacers 66 may be formed on the central portion of the 3D fins 54. The gate stack 64 may be formed by a conventional process and wraps around the central portion of the 3D fins 54. Thereafter, sidewall spacers 66 may be formed as described previously. The gate stack 64 may be a conventional gate stack or a replacement gate stack. In this exemplary embodiment, the gate stack 64 is a "dummy" gate stack comprising polysilicon over a gate dielectric such as oxide which are later removed and filled with the final gate stack material.

Figure 21A:
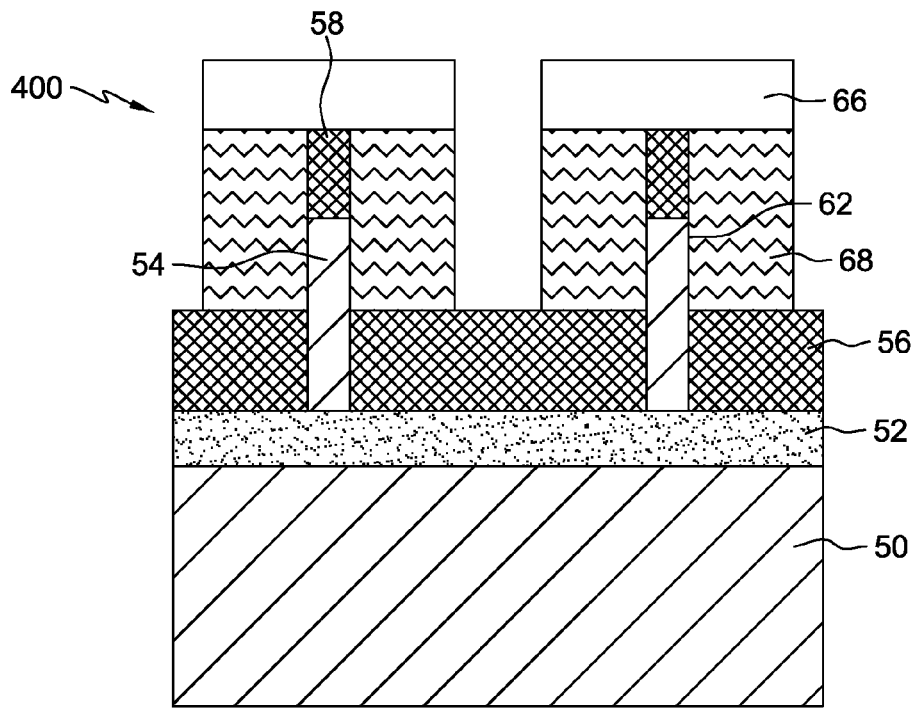
FIGS. 21A and 21B illustrate the formation of source and drain layers.
Figure 21B:
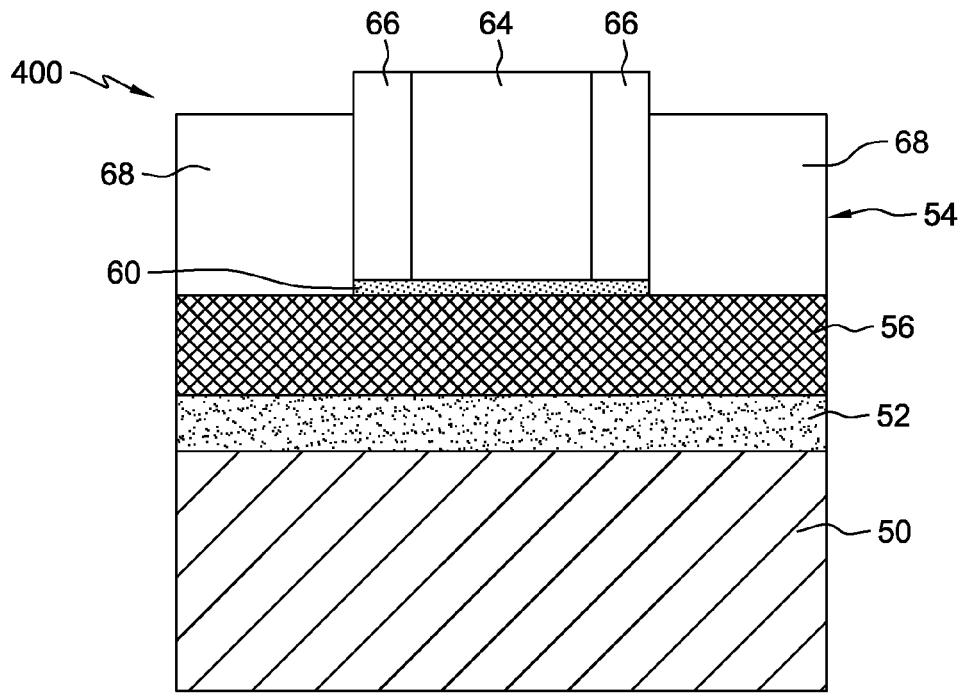

The sources and drains 68 are next formed by an epitaxial process as shown in FIGS. 21A and 21B.

Figure 22A:
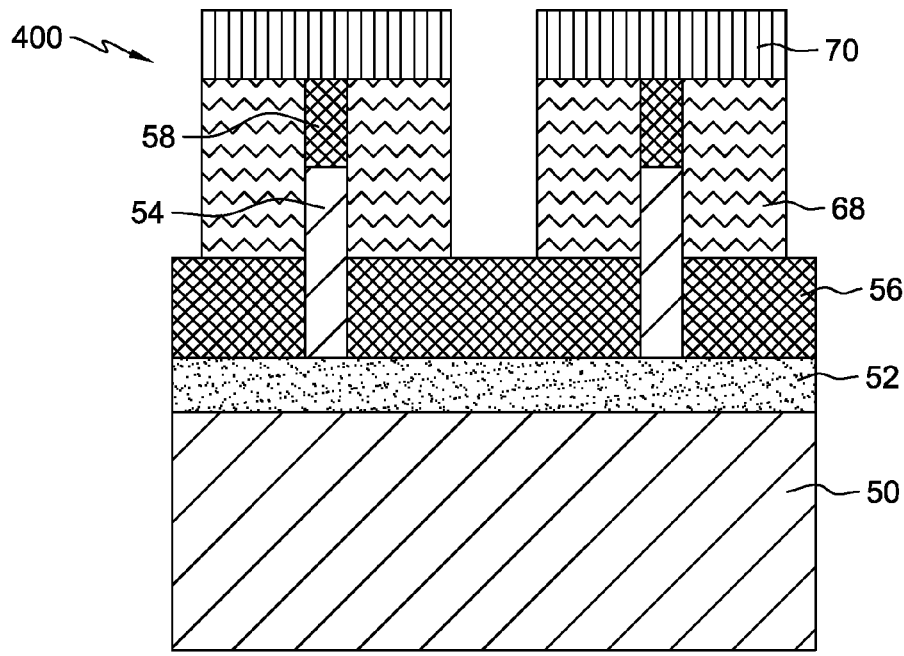
FIGS. 22A and 22B illustrate the removal of the gate stack.
Figure 22B:
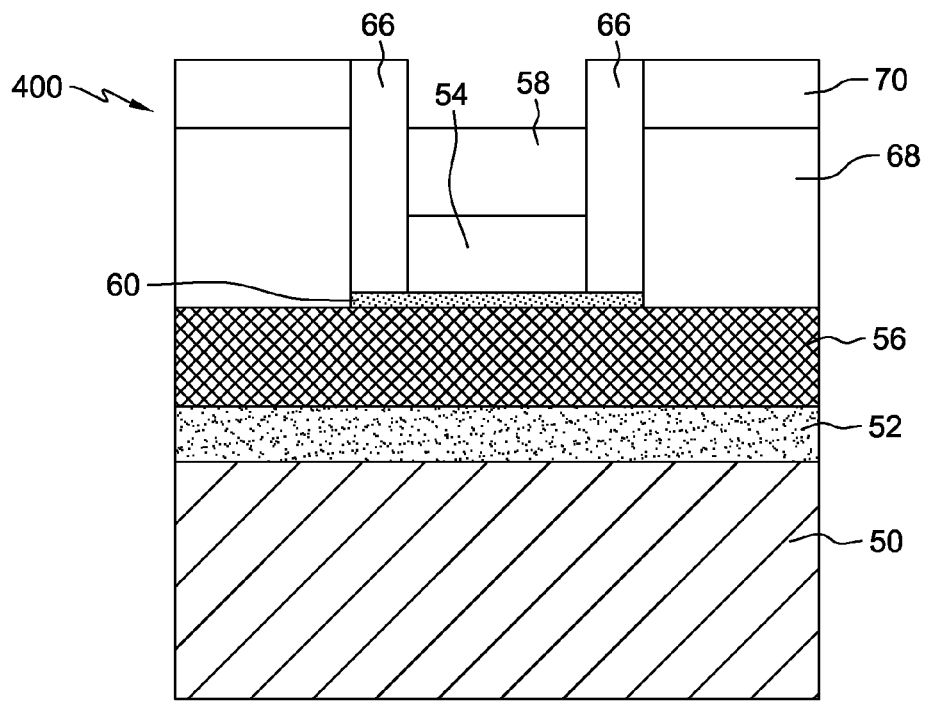

Referring now to FIGS. 22A and 22B, an interlayer dielectric 70 has been deposited. As best shown in FIG. 22B, the replacement gate 64 has been removed, exposing the central portion of the 3D fin 54 and nitride cap 58. The dummy gate oxide of the gate stack 64 and any oxide layer 60 on the 3D fin 54 and nitride cap 58 may be etched by a combination of dilute HF wet etching and dry etching. During the etching of the gate oxide, the oxide layer 60 formerly underneath the gate stack is also etched away.

Figure 23A:
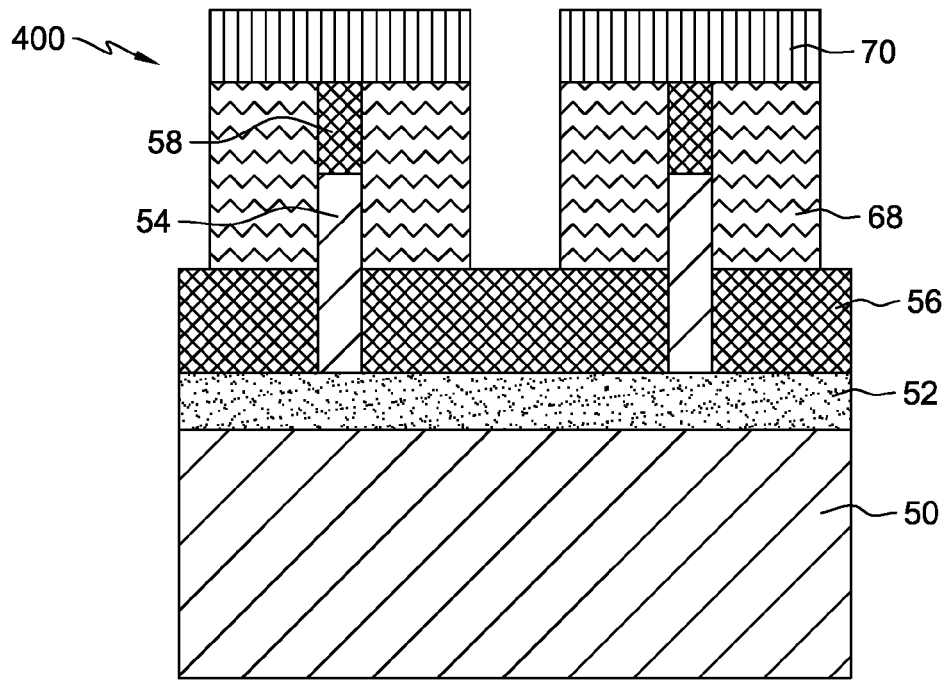
FIGS. 23A and 23B illustrate the recessing of the gate area by the removal of the nitride layer in the gate area.
Figure 23B:
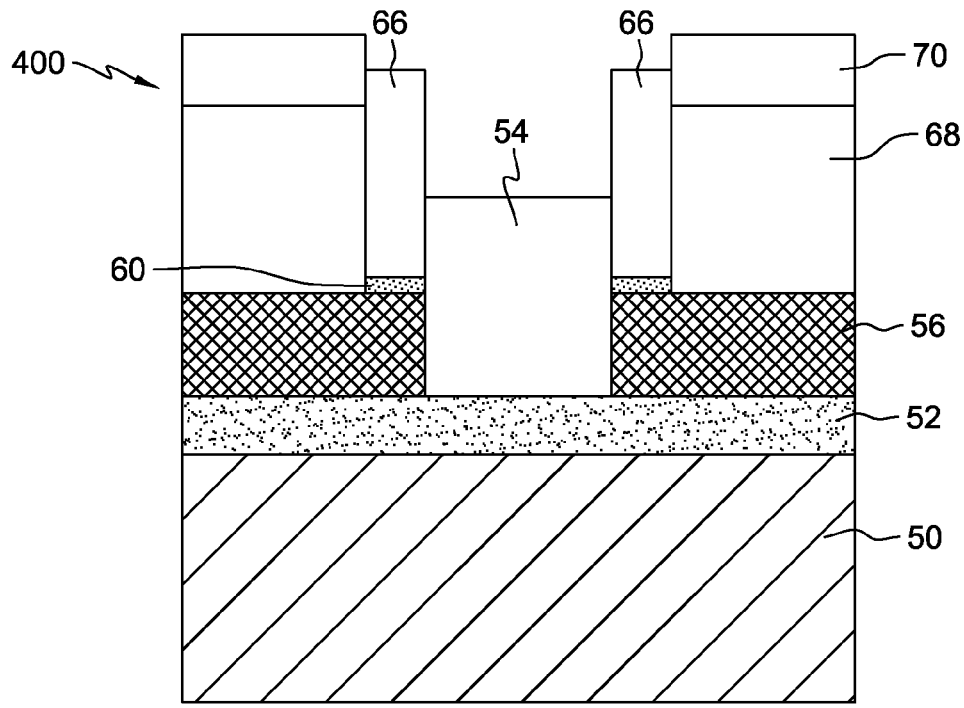

Thereafter, the exposed nitride layer 56 may be anisotropically etched with a selective RIE down to the BOX layer 52 which will also remove the nitride cap 58 on the top of the 3D fins 54. Sidewall spacers 66 may also be etched, thereby reducing their height. The resulting structure is shown in FIGS. 23A and 23B.

Figure 24A:
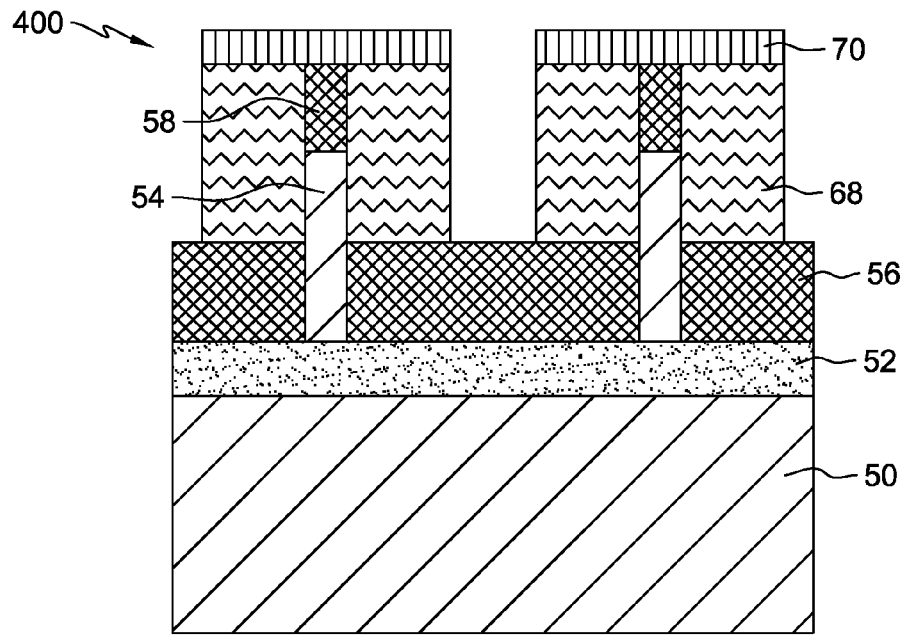
Figure 24B:
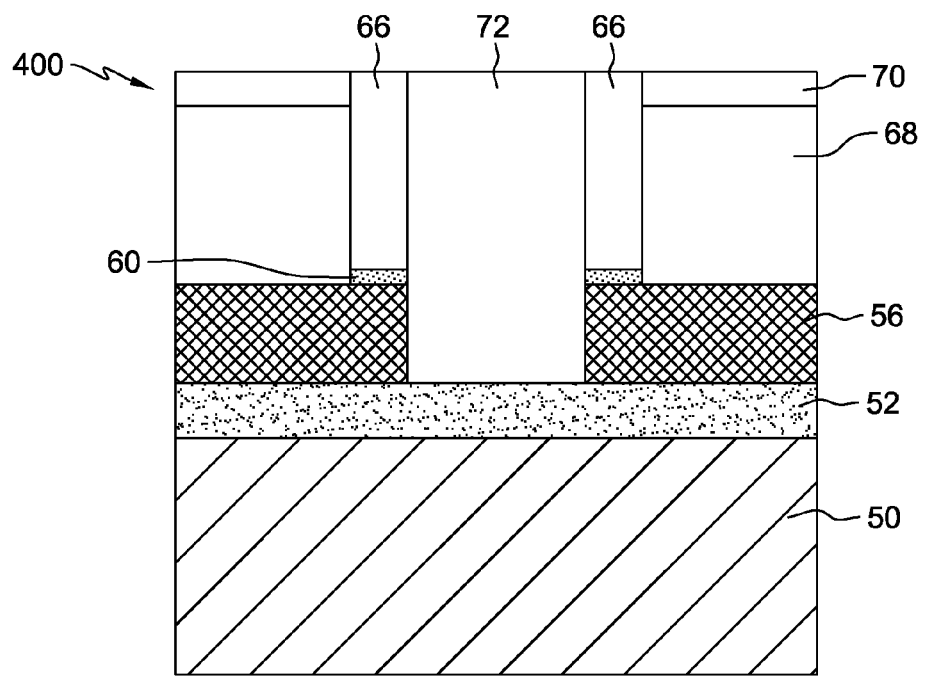

Referring now to FinFET semiconductor structure 400 in FIGS. 24A and 24B, replacement gate structure 72 has been added so as to be in direct contact with the BOX layer 52 and then the FinFET semiconductor structure 400 was planarized. The replacement gate structure 72 may include, for example, a gate dielectric, gate electrode, work function metals and nitride cap.

The FinFET semiconductor structure 400 may undergo further semiconductor processing to form contacts and back end of the line wiring. It should be noted that the oxide layer 60 remains between the sidewall spacers 66 and the nitride layer 56. A particular advantage of FinFET structure 400 is that the gate structure 72 is recessed below the level of the source/drain epitaxy 68.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A FinFET device comprising:
a semiconductor substrate;
a three dimensional fin oriented perpendicularly to the semiconductor substrate;
a local trench isolation between the three dimensional fin and an adjacent three dimensional fin;
a nitride layer on the local trench isolation;
a gate stack wrapped around a central portion of the three dimensional fin and extending through the nitride layer;
sidewall spacers adjacent to the gate stack and indirectly in contact with the nitride layer, two ends of the three dimensional fin extending from the sidewall spacers, a first end being for the source of the FET device and a second end being for a drain of the FET device; and
an epitaxial layer covering each end of the three dimensional fin and being on the nitride layer.

2. The FinFET device of claim 1 further comprising a dielectric layer separating the sidewall spacers from the nitride layer.

3. The FinFET device of claim 2 wherein the dielectric layer is only present between the sidewall spacers and the nitride layer.

4. The FinFET device of claim 1 wherein the epitaxial layer covering each end of the three dimensional fin is directly on the nitride layer.

5. The FinFET device of claim 1 wherein the ends of the three dimensional fin are even with the nitride layer.

6. The FinFET device of claim 1 wherein the gate stack stops on the local trench isolation.

7. The FinFET device of claim 1 wherein the gate stack extends into the local trench isolation.

8. The FinFET device of claim 1 wherein the ends of the three dimensional fin have a nitride cap and the central portion of the three dimensional fin is devoid of the nitride cap such that the gate stack is in direct contact with the three dimensional fin.

9. The FinFET device of claim 1 wherein the central portion of the three dimensional fin is devoid of the nitride cap such that the gate stack is in direct contact with the three dimensional fin.

10. The FinFET device of claim 1 wherein the dielectric layer is an oxide layer.

11. A FinFET device comprising:
a semiconductor substrate;
a three dimensional fin oriented perpendicularly to the semiconductor substrate;
a nitride layer between the three dimensional fin and an adjacent three dimensional fin;
a gate stack wrapped around a central portion of the three dimensional fin and extending through the nitride layer;
sidewall spacers adjacent to the gate stack and indirectly in contact with the nitride layer, two ends of the three dimensional fin extending from the sidewall spacers, a first end being for the source of the FET device and a second end being for a drain of the FET device; and
an epitaxial layer covering each end of the three dimensional fin and being on the nitride layer.

12. The FinFET device of claim 11 further comprising a dielectric layer separating the sidewall spacers from the nitride layer.

13. The FinFET device of claim 11 wherein the gate stack extends into the nitride layer.

\* \* \* \* \*